United States Patent
Zhang et al.

(10) Patent No.: US 7,701,198 B2
(45) Date of Patent: Apr. 20, 2010

(54) POWER MEASUREMENT APPARATUS

(75) Inventors: Chong Zhang, Shenzhen (CN); Cho-Ju Chung, Taipei Hsien (TW); Teng-Huei Chu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 37 days.

(21) Appl. No.: 12/211,031

(22) Filed: Sep. 15, 2008

(65) Prior Publication Data
US 2009/0322313 A1   Dec. 31, 2009

(30) Foreign Application Priority Data
Jun. 26, 2008   (CN) .................. 2008 1 0302363

(51) Int. Cl.
*G01R 1/30*   (2006.01)

(52) U.S. Cl. ................... 324/123 R; 324/126

(58) Field of Classification Search .................. None
See application file for complete search history.

(56) References Cited
U.S. PATENT DOCUMENTS
7,102,442 B2 *   9/2006   Anderson .................. 330/285

\* cited by examiner

*Primary Examiner*—Minh N Tang
(74) *Attorney, Agent, or Firm*—Frank R. Niranjan

(57) ABSTRACT

A power measurement apparatus includes a radio frequency input terminal, a measurement module, an interface, a memory, and a control unit. The radio frequency input terminal is connected to a radio frequency device. The measurement module is connected to the radio frequency input terminal to convert the radio frequency signal into a voltage signal. The interface is connected to the measurement module, receiving and transmitting the voltage signal from the measurement module. The memory is connected to the interface to store a voltage-power table related to the radio frequency signal. The control unit is connected to the interface to query the voltage-power table in the memory via the interface, and obtain the power of the radio frequency device according to the voltage signal output from the measurement module.

16 Claims, 3 Drawing Sheets

POWER MEASUREMENT APPARATUS

BACKGROUND

1. Field of the Disclosure

The disclosure relates to power measurement apparatuses, and particularly to an apparatus testing RF power during device manufacture.

2. Description of the Related Art

Typically, performance testing is required for RF devices during manufacture. Such tests may include employing a power meter to obtain an accurate measurement of the RF power. However, RF testing instruments, such as the described power meter, are costly. Batch productions of RF devices are especially costly due to the necessity for multiple RF testing instruments.

DETAILED DESCRIPTION

Figure 1:
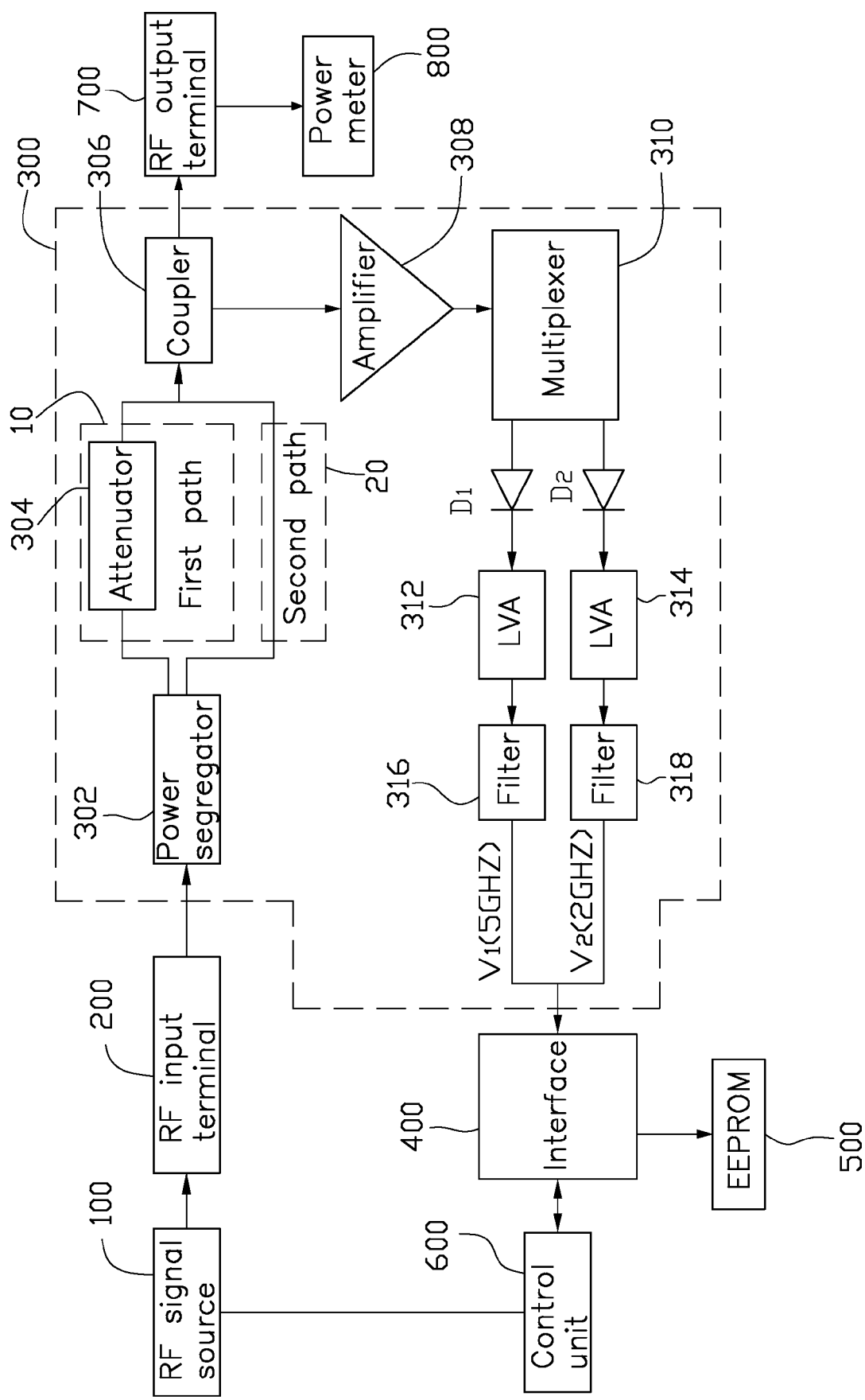
FIG. 1 is a circuit diagram of an embodiment of a power measurement apparatus in accordance with the disclosure.

Referring to FIG. 1, a power measurement apparatus in accordance with an embodiment of the disclosure is configured to measure power output from a radio-frequency (RF) device. The power measurement apparatus includes an RF input terminal 200, a measurement module 300, an interface 400, an electrically erasable programmable read-only memory (EEPROM) 500, a control unit 600, and an RF output terminal 700.

The RF input terminal 200 is connected to an RF signal source 100 and/or an RF device (not shown). The RF signal source 100 provides a series of predetermined RF signals with which the power measurement apparatus can generate a voltage-power table (VPT). The EEPROM 500 is configured to store the VPT. The power measurement apparatus thus obtains the power value of the RF device by querying the VPT. The interface 400 includes a universal asynchronous receiver and transmitter (UART) to communicate with the measurement module 300, the EEPROM 500, and the control unit 600. The control unit 600 employs a personal computer to provide control commands.

The measurement module 300 includes a power segregator 302, an attenuator 304, a coupler 306, an amplifier 308, a multiplexer 310, two diodes D1 and D2, two log video amplifier (LVAs) 312 and 314, and two filters 316 and 318. An input terminal of the power segregator 302, functioning as an input terminal of the measurement module 300, is connected to the RF input terminal 200. An input terminal of the attenuator 304 is connected to an output terminal of the power segregator 302. An input terminal of the coupler 306 is connected to the output terminals of the power segregator 302 and the attenuator 304. An input terminal of the amplifier 308 is connected to an output terminal of the coupler 306, while another output terminal of the coupler 306, functioning as a first output terminal of the measurement module 300, is connected to the RF output terminal 700. An input terminal of the multiplexer 310 is connected to an output terminal of the amplifier 308. The anodes of the diodes D1 and D2 are connected to two output terminals of the multiplexer 310, respectively. The input terminals of the LVAs 312 and 314 are connected to the cathodes of the diodes D1 and D2, respectively. The input terminals of the filters 316 and 318 are connected to the output terminals of the LVAs 312 and 314, respectively. The output terminals of the filters 316 and 318 connected to each other, functioning as the second output terminal of the measurement module 300, are connected to the interface 400.

The VPT is created and stored in the EEPROM 500 before measuring the power of the RF device. The RF signal source 100 is connected between the RF input terminal 200 and the control unit 600, and a power meter 800 is connected to the RF output terminal 700. The control unit 600 directs the RF signal source 100 to emit a series of predetermined RF signals.

In the embodiment, the control unit 600 directs the RF signal source 100 to emit an RF signal of 0~25 dbm, along with a 5 GHz and/or 2 GHz frequency band, thereby ensuring that the RF signal is within the range of the measurement module 300. The control unit 600 directs the RF signal source 100 to emit an RF signal every 0.5 db from the 0 db. The RF signal is sent to the measurement module 300 via the RF input terminal 200. The power segregator 302 separates the RF signal into first and second signals according to the power. The first signal with the power range of 13 dbm~25 dbm is transmitted to the coupler 306 via a first path 10. The first path 10 includes the attenuator 304, which attenuates the magnitude of the RF signal from the power range of 13 dbm~25 dbm to a power range of 0 dbm~12 dbm. The second signal with the power range of 0 dbm~12 dbm is transmitted into the coupler 306 via a second path 20. The second path 20 is a conventional wire connected between the power segregator 302 and the coupler 306. The coupler 306 couples the received RF signal. The coupler 306 transmits the RF signal to the power meter 800 via the RF output terminal 700. The RF signal is measured by the power meter 800 and the result manually stored in the EEPROM 500. The coupler 306 also transmits the RF signal to the amplifier 308, which expands the dynamic range of the RF signal, and then transmits the amplified RF signal to the multiplexer 310.

The multiplexer 310 separates the RF signal into third and fourth signals based on the frequency of the RF signal. The third signal with the 5 GHz frequency band is transmitted to the LVA 312 via the diode D1. The LVA 312 converts power P1 of the third signal into a voltage V1 and obtains a linear curve of the power P1 versus the voltage V1 of the third signal. The control unit 600 stores the voltage V1 in the EEPROM 500 via the interface 400. The fourth signal with the 2 GHz frequency band is transmitted to the LVA 314 via the diode D2. The LVA 314 converts the power P2 of the fourth signal into a voltage V2 and obtains a linear curve of the power P2 versus the voltage V2 of the fourth signal. The control unit 600 stores the voltage V2 in the EEPROM 500 via the interface 400. The RF signal source 100 emits the RF signal until the power of the RF signal reaches a maximum of 25 dbm. Subsequently, the control unit 600 creates the VPT in the EEPROM 500 according to the powers P1, P2 and the corresponding voltages V1, V2.

When the VPT has been completed, in practice, the RF signal source 100 is disconnected from the RF input terminal 200 and the power meter 800 disconnected from the RF output terminal 700 during the power measurement. The RF input terminal 200 is connected to the RF device to measure the power of a signal output from the RF device. The RF signal output from the RF device is transmitted to the measurement module 300 via the RF input terminal 200 to obtain a voltage V. If the voltage V belongs to the voltage V1, the control unit 600 queries the VPT in the EEPROM 500 to obtain a power P belonging to the power P1. Otherwise, if the voltage V belongs to the voltage V2, the control unit 600 queries the VPT in the EEPROM 500 to obtain a power P belonging to the power P2.

Figure 2:
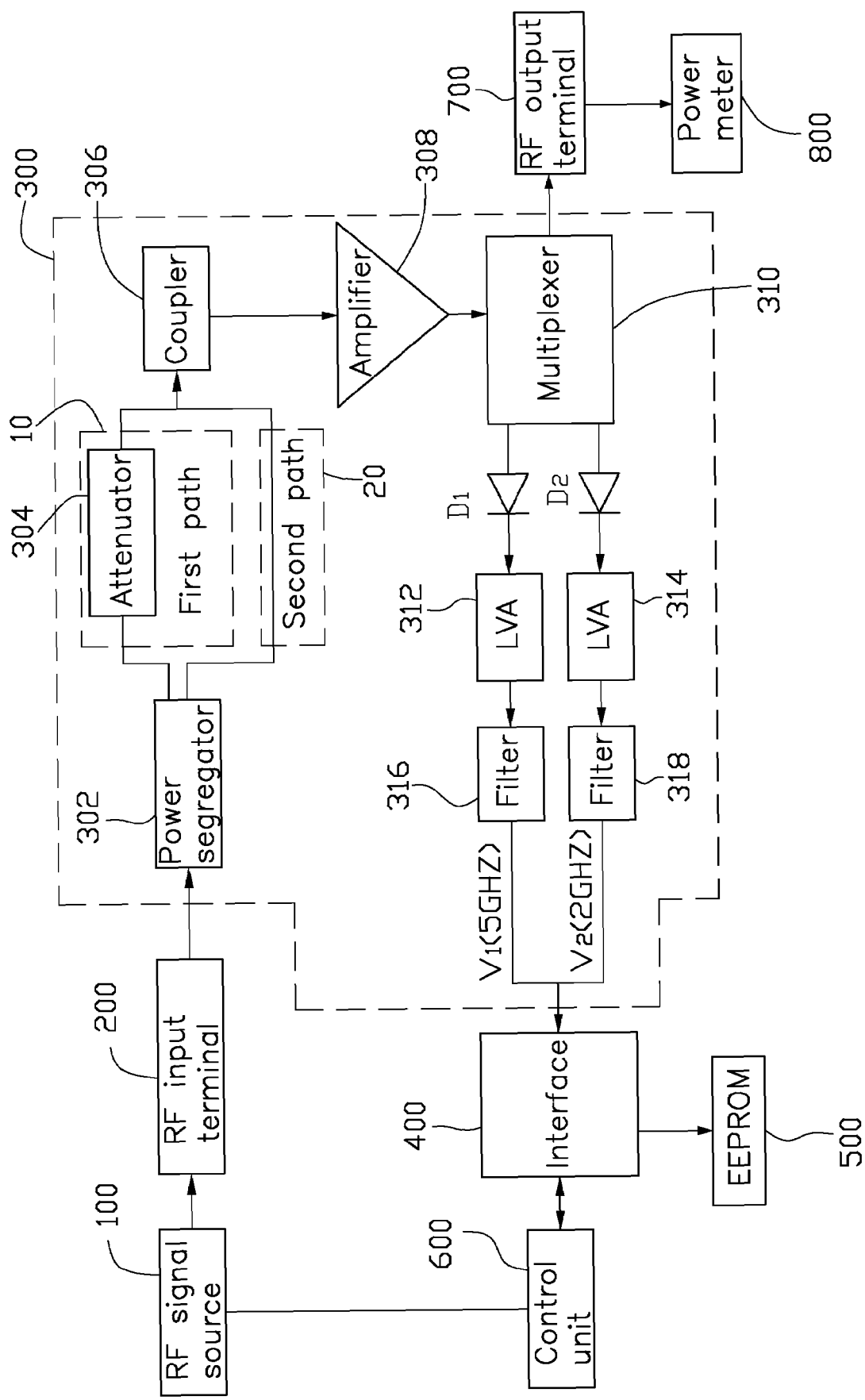
FIG. 2 is a circuit diagram of another embodiment of a power measurement apparatus in accordance with the disclosure.

Referring to FIG. 2, the RF input terminal 700 can also be connected to the multiplexer 310. The power meter 800 measures an amplified power of the RF signal from the RF signal source 100, thereby dividing the obtained power in practice by a plus of the amplifier 308.

Figure 3:
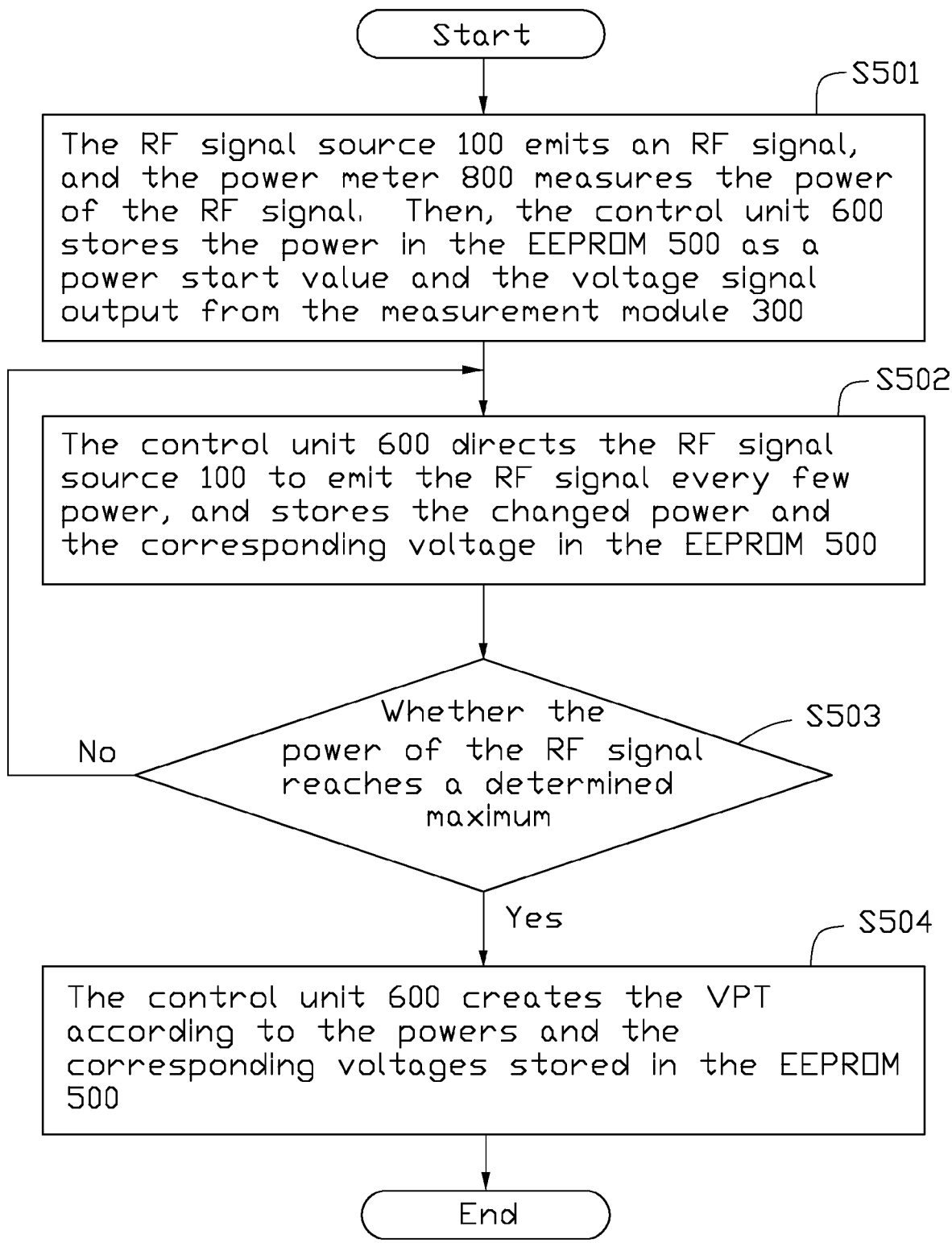
FIG. 3 is a flow chart of a method of creating a voltage-power table applied to the power measurement apparatus of FIG. 1.

Referring to FIG. 3, a method of creating the VPT stored in the EEPROM 500 is provided, which includes the following steps.

In Step S501, control unit 600 directs the RF signal source 100 to emit an RF signal in the measurement range of the measurement module 300. The power meter 800 measures the power of the RF signal. The control unit 600 stores the power in the EEPROM 500 as a start value, and stores the voltage of the RF signal output from the measurement module 300 in the EEPROM 500.

In step S502, control unit 600 directs the RF signal source 100 to emit an RF signal at every successive 0.5 dbm interval from 0 dbm to 25 dbm, and stores the changed power and the corresponding voltage in the EEPROM 500.

In step S503, control unit 600 determines whether the power of the RF signal has reached a predetermined maximum, such as 25 dbm. If so, step S504 is executed. If not, step S502 is repeated.

S504, control unit 600 creates a VPT according to the power and corresponding voltage stored in the EEPROM 500.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A power measurement apparatus, comprising:
   a radio frequency (RF) input terminal connected to an RF device;
   a measurement module connected to the RF input terminal to receive an RF signal output from the RF device, converting the RF signal into a voltage signal;
   an interface connected to the measurement module receiving and transmitting the voltage signal;
   a memory connected to the interface storing a voltage-power table related to the RF signal; and
   a control unit connected to the interface;
   wherein the RF signal output from the RF device is sent to the measurement module via the RF input terminal, and the control unit queries the voltage-power table in the memory via the interface to obtain a power corresponding to the voltage signal output from the measurement module.

2. The power measurement apparatus as claimed in claim 1, wherein the memory is an electrically erasable programmable read-only memory (EEPROM).

3. The power measurement apparatus as claimed in claim 1, wherein the interface comprises a universal asynchronous receiver and transmitter (UART).

4. The power measurement apparatus as claimed in claim 1, wherein the control unit is a personal computer.

5. The power measurement apparatus as claimed in claim 1, wherein the measurement module comprises a power segregator, an attenuator, a coupler, an amplifier, a multiplexer, a first log video amplifier (LVA) and a second LVA; wherein the power segregator comprises:
   a segregator input terminal connected to the RF input terminal; and
   a segregator output terminal;
the attenuator comprises:
   an attenuator input terminal connected to the segregator output terminal; and
   an attenuator output terminal;
the coupler comprises:
   a coupler input terminal connected to the attenuator output terminal; and
   a coupler output terminal;
the amplifier comprises:
   an amplifier input terminal connected to the coupler output terminal; and
   an amplifier output terminal;
the multiplexer comprises:
   a multiplexer input terminal connected to the amplifier output terminal;
   a first multiplexer output terminal; and
   a second multiplexer output terminal;
the first LVA comprises:
   a first LVA input terminal connected to the first multiplexer output terminal; and
   a first LVA output terminal connected to the interface; and
the second LVA comprises:
   a second LVA input terminal connected to the second multiplexer output terminal; and
   a second LVA output terminal connected to the interface.

6. The power measurement apparatus as claimed in claim 5, wherein the measurement module further comprises a first diode, a second diode, a first filter, and a second filter; wherein the first diode is connected between the multiplexer and the first LVA, and comprises:
   a first diode anode connected to the first multiplexer output terminal; and
   a first diode cathode connected to the first LVA input terminal;
the second diode is connected between the multiplexer and the second LVA, and comprises:
   a second diode anode connected to the second multiplexer output terminal; and
   a second diode cathode connected to the second LVA input terminal;
the first filter is connected between the first LVA and the interface, and comprises:
   a first filter input terminal connected to the first LVA output terminal; and
   a first filter output terminal connected to the interface; and
the second filter is connected between the second LVA and the interface, and comprises:
   a second filter input terminal connected to the second LVA output terminal; and
   a second filter output terminal connected to the interface.

7. A method of fabricating a power measurement apparatus, comprising:
   providing a radio frequency (RF) signal source emitting a series of predetermined RF signals;
   providing an RF input terminal configured to receive the RF signal output from the RF signal source;
   providing a measurement module connected to the RF input terminal to convert the RF signal into a voltage signal;
   providing an RF output terminal connected to the measurement module to output the RF signal;

providing a power meter connected to the RF output terminal to measure the power of the RF signal;
providing an interface connected to the measurement module receiving and transmitting the voltage signal output from the measurement module;
providing a memory connected to the interface storing the voltage signal output from the measurement module and the corresponding power measured by the power meter; and
providing a control unit connected between the interface and the RF signal source;
wherein the control unit directs the RF signal source to emit a series of predetermined RF signals, the measurement module converts the RF signals into voltage signals, and the power meter measures the power of the RF signals, by which the control unit creates a voltage-power table in the memory.

8. The method as claimed in claim 7, wherein the memory is an electrically erasable programmable read-only memory (EEPROM).

9. The method as claimed in claim 7, wherein the interface is a universal asynchronous receiver and transmitter (UART).

10. The method as claimed in claim 7, wherein the control unit is a personal computer.

11. The method as claimed in claim 7, wherein the measurement module comprises a power segregator, an attenuator, a coupler, an amplifier, a multiplexer, a first log video amplifier (LVA) and a second LVA; and wherein the power segregator comprises:
a segregator input terminal connected to the RF input terminal; and
a segregator output terminal;
the attenuator comprises:
an attenuator input terminal connected to the segregator output terminal; and
an attenuator output terminal;
the coupler comprises:
a coupler input terminal connected to the attenuator output terminal;
a first coupler output terminal connected to the RF output terminal; and
a second coupler output terminal;
the amplifier comprises:
an amplifier input terminal connected to the second coupler output terminal; and
an amplifier output terminal;
the multiplexer comprises:
a multiplexer input terminal connected to the amplifier output terminal;
a first multiplexer output terminal; and
a second multiplexer output terminal;
the first LVA comprises:
a first LVA input terminal connected to the first multiplexer output terminal; and
a first LVA output terminal connected to the interface; and
the second LVA comprises:
a second LVA input terminal connected to the second multiplexer output terminal; and
a second LVA output terminal connected to the interface.

12. The method as claimed in claim 11, wherein the measurement module further comprises a first diode, a second diode, a first filter, and a second filter; and wherein the first diode is connected between the multiplexer and the first LVA, and comprises:
a first diode anode connected to the first multiplexer output terminal; and
a first diode cathode connected to the first LVA input terminal;
the second diode is connected between the multiplexer and the second LVA, and comprises:
a second diode anode connected to the second multiplexer output terminal; and
a second diode cathode connected to the second LVA input terminal;
the first filter is connected between the first LVA and the interface, and comprises:
a first filter input terminal connected to the first LVA output terminal; and
a first filter output terminal connected to the interface; and
the second filter is connected between the second LVA and the interface, and comprises:
a second filter input terminal connected to the second LVA output terminal; and
a second filter output terminal connected to the interface.

13. The method as claimed in claim 7, wherein the measurement module comprises a power segregator, an attenuator, a coupler, an amplifier, a multiplexer, a first log video amplifier (LVA) and a second LVA; wherein the power segregator comprises:
a segregator input terminal connected to the RF input terminal; and
a segregator output terminal;
the attenuator comprises:
an attenuator input terminal connected to the segregator output terminal; and
an attenuator output terminal;
the coupler comprises:
a coupler input terminal connected to the attenuator output terminal; and
a coupler output terminal;
the amplifier comprises:
an amplifier input terminal connected to the coupler output terminal; and
an amplifier output terminal;
the multiplexer comprises:
a multiplexer input terminal connected to the amplifier output terminal;
a first multiplexer output terminal connected to the RF output terminal;
a second multiplexer output terminal; and
a third multiplexer output terminal
the first LVA comprises:
a first LVA input terminal connected to the second multiplexer output terminal; and
a first LVA output terminal connected to the interface; and
the second LVA comprises:
a second LVA input terminal connected to the third multiplexer output terminal; and
a second LVA output terminal connected to the interface.

14. The method as claimed in claim 13, wherein the measurement module further comprises a first diode, a second diode, a first filter, and a second filter; the first diode is connected between the multiplexer and the first LVA, and comprises:
a first diode anode connected to the second multiplexer output terminal; and
a first diode cathode connected to the first LVA input terminal;
the second diode is connected between the multiplexer and the second LVA, and comprises:
a second diode anode connected to the third multiplexer output terminal; and a second diode cathode connected to the second LVA input terminal;

the first filter is connected between the first LVA and the interface, and comprises:

a first filter input terminal connected to the first LVA output terminal; and a first filter output terminal connected to the interface; and the second filter is connected between the second LVA and the interface, and comprises:

a second filter input terminal connected to the second LVA output terminal; and a second filter output terminal connected to the interface.

15. The method as claimed in claim 7, wherein creation of the voltage-power table comprises:

the control unit directing the RF signal source to emit an RF signal in the measurement range of the measurement module, and the power meter measuring the power of the RF signal;

the control unit storing the power in the memory as a start value, and storing the voltage of the RF signal output from the measurement module in the memory;

the control unit directing the RF signal source to emit the RF signal at every successive power interval, and storing the changed power and the corresponding voltage in the memory;

the control unit determining whether the power of the RF signal reaches a predetermined maximum; and, if so, creating the voltage-power table according to the power and the corresponding voltage for storage in the memory.

16. The method as claimed in claim 13, wherein if the power of the RF signal does not reach the predetermined maximum, the control unit continues to direct the RF signal source to emit the RF signal, and stores the changed power and the corresponding voltage in the memory.

\* \* \* \* \*